US010418367B2

(12) United States Patent
Chang et al.

(10) Patent No.: US 10,418,367 B2
(45) Date of Patent: Sep. 17, 2019

(54) METHOD FOR FABRICATING AIR GAP ADJACENT TO TWO SIDES OF BIT LINE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Yi-Ching Chang, Pingtung County (TW); Feng-Yi Chang, Tainan (TW); Fu-Che Lee, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/029,638

(22) Filed: Jul. 8, 2018

(65) Prior Publication Data
US 2018/0337186 A1 Nov. 22, 2018

Related U.S. Application Data

(62) Division of application No. 15/632,394, filed on Jun. 26, 2017, now Pat. No. 10,043,809.

(30) Foreign Application Priority Data

May 17, 2017 (CN) .......................... 2017 1 0347829

(51) Int. Cl.
*H01L 21/768* (2006.01)
*H01L 27/108* (2006.01)

(52) U.S. Cl.
CPC .... *H01L 27/10885* (2013.01); *H01L 21/7682* (2013.01); *H01L 27/10894* (2013.01); *H01L 27/10888* (2013.01); *H01L 27/10897* (2013.01)

(58) Field of Classification Search
CPC ............ H01L 21/7682; H01L 27/1023; H01L 27/108–10897
See application file for complete search history.

(56) References Cited

U.S. PATENT DOCUMENTS 9,379,004 B1 6/2016 Kwon et al.
2014/0054659 A1 2/2014 Seo
(Continued)

FOREIGN PATENT DOCUMENTS

CN 102569248 A 7/2012
CN 106504985 A 3/2017

OTHER PUBLICATIONS

Wang, Title of Invention:Semiconductor Memory Device and Manufacturing Method Thereof, U.S. Appl. No. 15/479,294, filed Apr. 5, 2017.

*Primary Examiner* — Daniel P Shook
(74) *Attorney, Agent, or Firm* — Winston Hsu

(57) ABSTRACT

A method for fabricating semiconductor device includes the steps of: providing a substrate having a cell region and a peripheral region; forming a bit line structure on the cell region and a gate structure on the peripheral region; forming an interlayer dielectric (ILD) layer around the bit line structure and the gate structure; forming a conductive layer on the bit line structure; performing a first photo-etching process to remove part of the conductive layer for forming storage contacts adjacent two sides of the bit line structure and contact plugs adjacent to two sides of the gate structure; forming a first cap layer on the cell region and the peripheral region to cover the bit line structure and the gate structure; and performing a second photo-etching process to remove part of the first cap layer on the cell region.

20 Claims, 15 Drawing Sheets

(56) References Cited

U.S. PATENT DOCUMENTS

2016/0307906 A1   10/2016  Kim
2017/0271340 A1*  9/2017  Kim .................. H01L 27/10814

* cited by examiner

METHOD FOR FABRICATING AIR GAP ADJACENT TO TWO SIDES OF BIT LINE

CROSS REFERENCE TO RELATED APPLICATIONS

This application is a division of U.S. application Ser. No. 15/632,394 filed Jun. 26, 2017, and incorporated herein by reference in its entirety.

BACKGROUND OF THE INVENTION

1. Field of the Invention

The invention relates to a method for fabricating semiconductor device, and more particularly to a method for fabricating air gap adjacent to two sides of a bit line.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: providing a substrate having a cell region and a peripheral region; forming a bit line structure on the cell region and a gate structure on the peripheral region; forming an interlayer dielectric (ILD) layer around the bit line structure and the gate structure; forming a conductive layer on the cell region and the peripheral region; performing a first photo-etching process to remove part of the conductive layer for forming storage contacts adjacent two sides of the bit line structure and contact plugs adjacent to two sides of the gate structure; forming a first cap layer on the cell region and the peripheral region to cover the bit line structure and the gate structure; and performing a second photo-etching process to remove part of the first cap layer on the cell region.

According to another aspect of the present invention, a semiconductor device includes: a substrate having a cell region and a peripheral region; a bit line structure on the cell region; air gaps adjacent to two sides of the bit line structure; a first cap layer on the bit line structure and the air gaps, wherein the first cap layer is U-shaped; and a second cap layer on the first cap layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
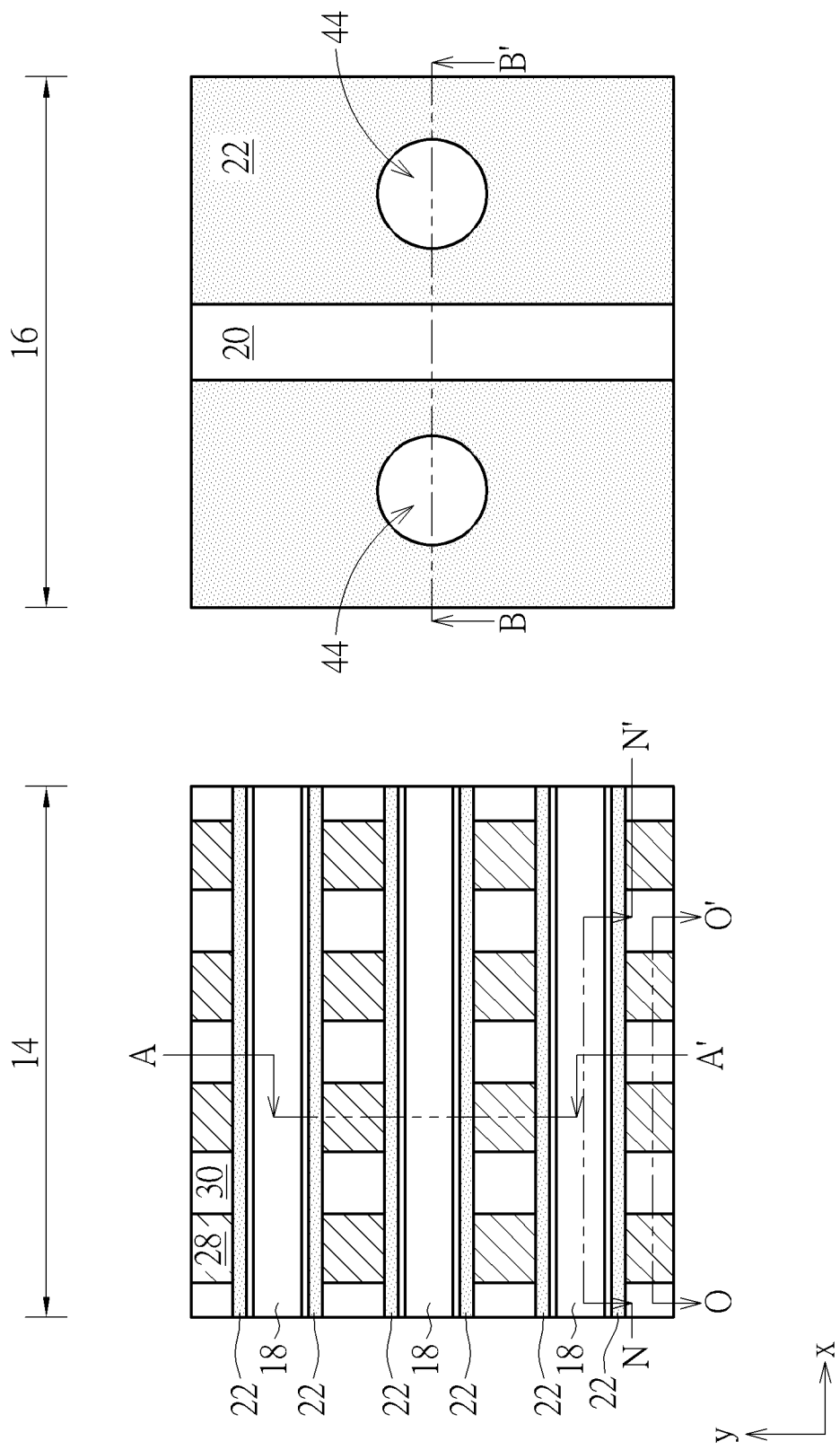
FIG. 1 illustrates a top view for fabricating a DRAM device according to an embodiment of the present invention.
Figure 2:
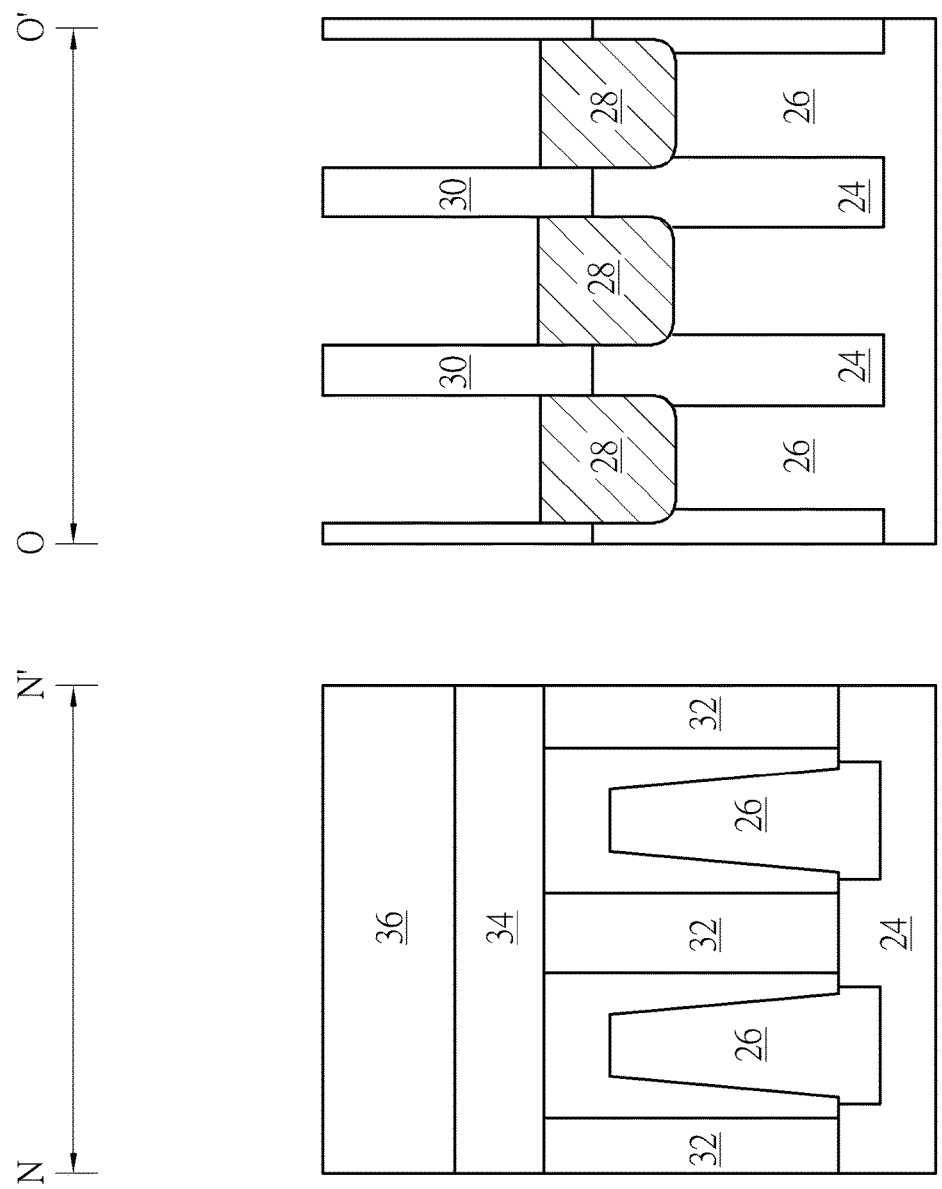
FIG. 2 illustrates cross-section views of FIG. 1 along the sectional lines NN' and OO'.
Figure 3:
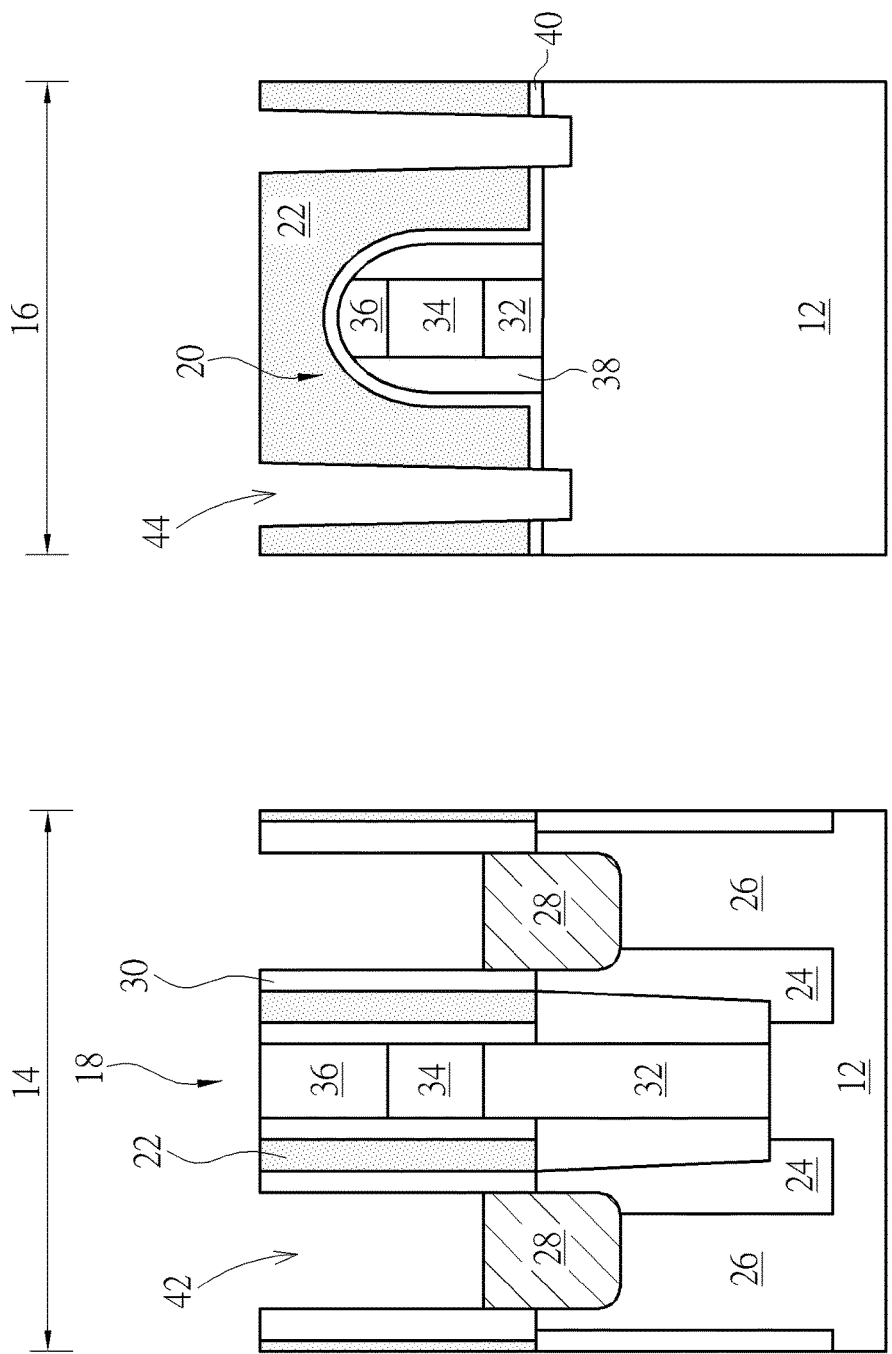
FIG. 3 illustrates cross-section views of FIG. 1 along the sectional lines AA' and BB'.

Referring to FIGS. 1-15, FIGS. 1-15 illustrate a method for fabricating a semiconductor device according to an embodiment of the present invention, in which FIG. 1 illustrates a top view for fabricating a DRAM device according to an embodiment of the present invention, the left portion of FIG. 2 illustrates a cross-sectional view of FIG. 1 along the sectional line NN', the right portion of FIG. 2 illustrates a cross-sectional view of FIG. 1 along the sectional line OO', the left portion of FIG. 3 illustrates a cross-sectional view of FIG. 1 along the sectional line AA', and the right portion of FIG. 3 illustrates a cross-sectional view of FIG. 1 along the sectional line BB'. As shown in FIGS. 1-3, a substrate 12 is provided and a cell region 14 and a peripheral region 16 are defined on the substrate 12. Preferably, the substrate 12 is made of semiconductor material including but not limited to for example a silicon substrate, an epitaxial substrate, a silicon germanium substrate, a silicon carbide substrate, or a silicon-on-insulator (SOI) substrate, but not limited thereto.

Next, bit line structures 18 are formed on the cell region 14 and a gate structure 20 is formed on the peripheral region 16, and an interlayer dielectric (ILD) layer 22 is formed around the bit line structures 18 and the gate structure 20. In this embodiment, word line structures (not shown), shallow trench isolations (STI) 24, and active region 26 could be formed in the substrate 12 under the bit line structures 18, in which doped region 28 and spacers 30 are formed adjacent to two sides of each of the bit line structures 18 and each of the bit line structures 18 includes an non-metal conductive layer 32, a selective barrier layer (not shown), a metal layer 34, and a hard mask 36. Preferably, the non-metal conductive layer 32 includes polysilicon, amorphous silicon, or other silicon-containing or non-silicon conductive material, the metal layer 34 could include Al, W, Cu, Ti—Al alloy, or other low resistance conductive material, and the hard mask 36 could include SiN, SiON, SiCN, or other insulating material.

Similar to the bit line structures 18, the gate structure 20 also includes a non-metal conductive layer 32, a metal layer 34, and a hard mask 36. Moreover, a spacer 38 is disposed around the gate structure 20, a doped region or source/drain region (not shown) is disposed in the substrate 12 adjacent to two sides of the spacer 38, a CESL 40 is disposed on the gate structure 20 and the spacer 38, and the ILD layer 22 is disposed on the CESL 40.

Next, part of the ILD layer 22 on the cell region 14 and peripheral region 16 could be removed to form contact holes 42 adjacent to two sides of the bit line structure 18 and contact holes 44 adjacent to two sides of the gate structure 20.

Figure 4:
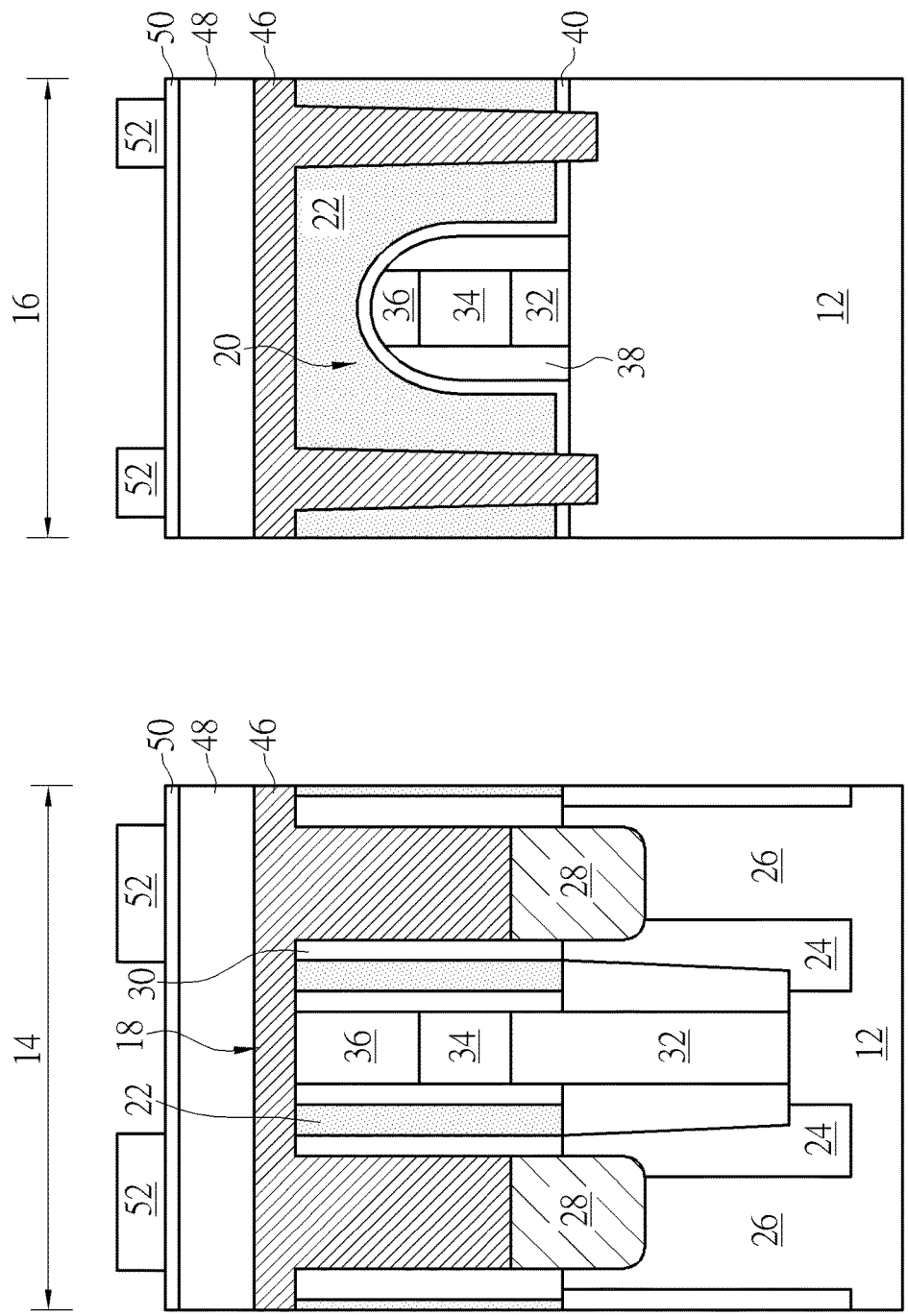
FIG. 4 illustrates cross-sectional views of the process conducted after FIG. 3.

Next, as shown in FIG. 4, a conductive layer 46 is formed on the cell region 14 and peripheral region 16 to fill the contact holes 42, 44 and a first photo-etching process is conducted to remove part of the conductive layer 46 to form storage contacts adjacent to two sides of the bit line structure 18 and contact plugs adjacent to two sides of the gate structure 20. Specifically in this embodiment, the first photo-etching process could be accomplished by first forming multiple pattern transfer material layers on the cell region 14 and peripheral region 16, including sequentially forming an organic dielectric layer (ODL) 48, a silicon-containing hard mask bottom anti-reflective coating (SHB) 50, and a patterned resist 52 on the conductive layer 46.

Figure 5:
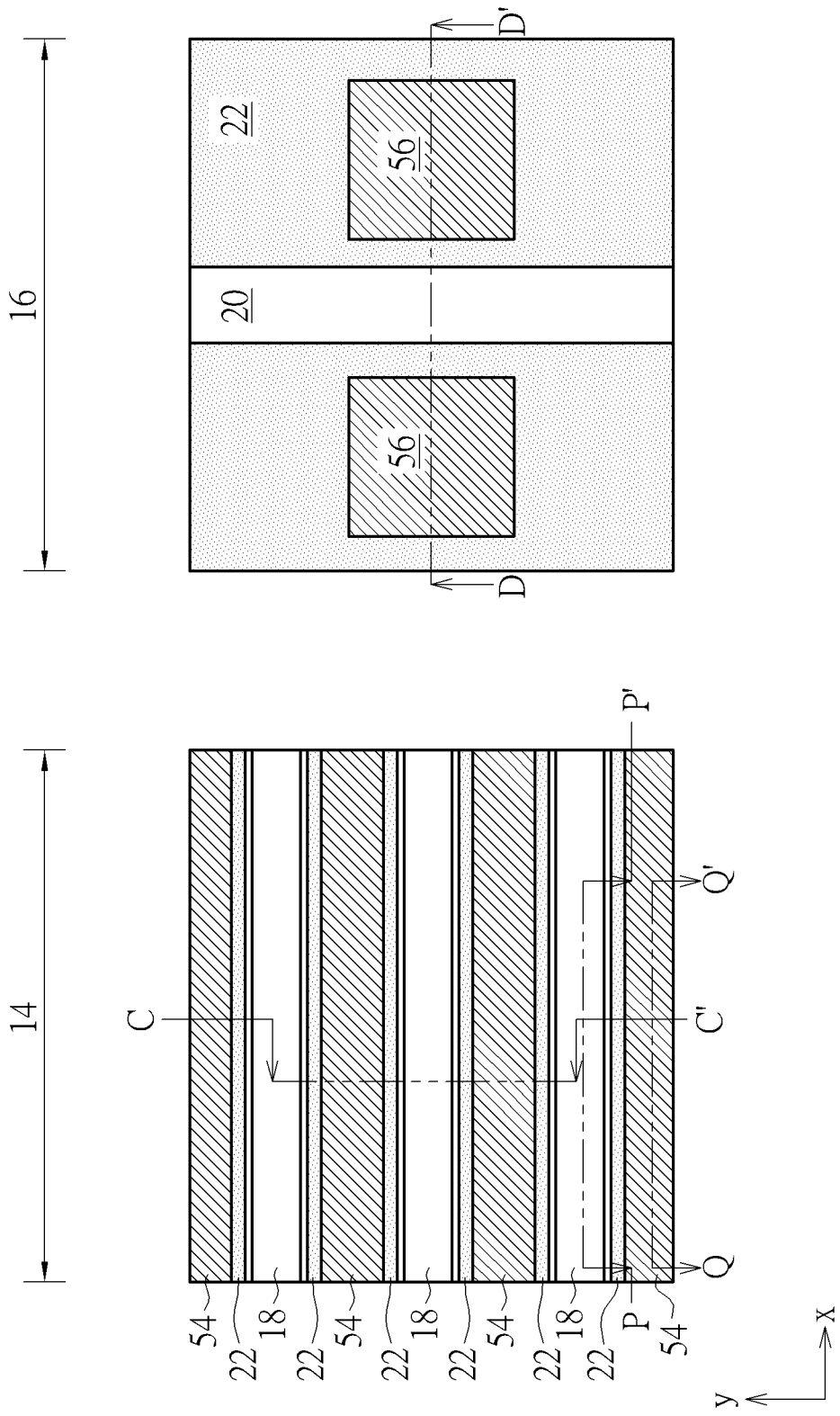
FIG. 5 illustrates top views of the process conducted after FIG. 4.
Figure 6:
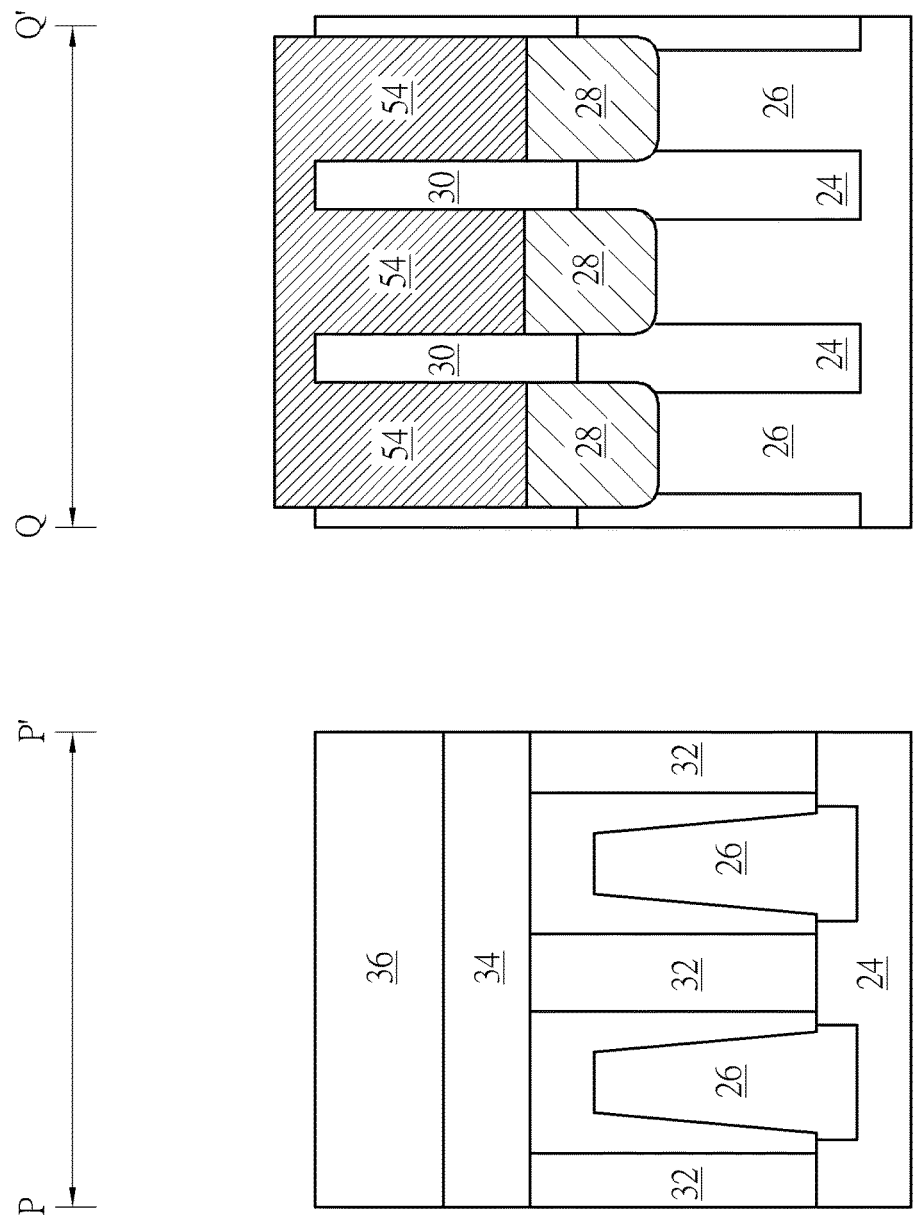
FIG. 6 illustrates cross-section views of FIG. 5 along the sectional lines PP' and QQ'.
Figure 7:
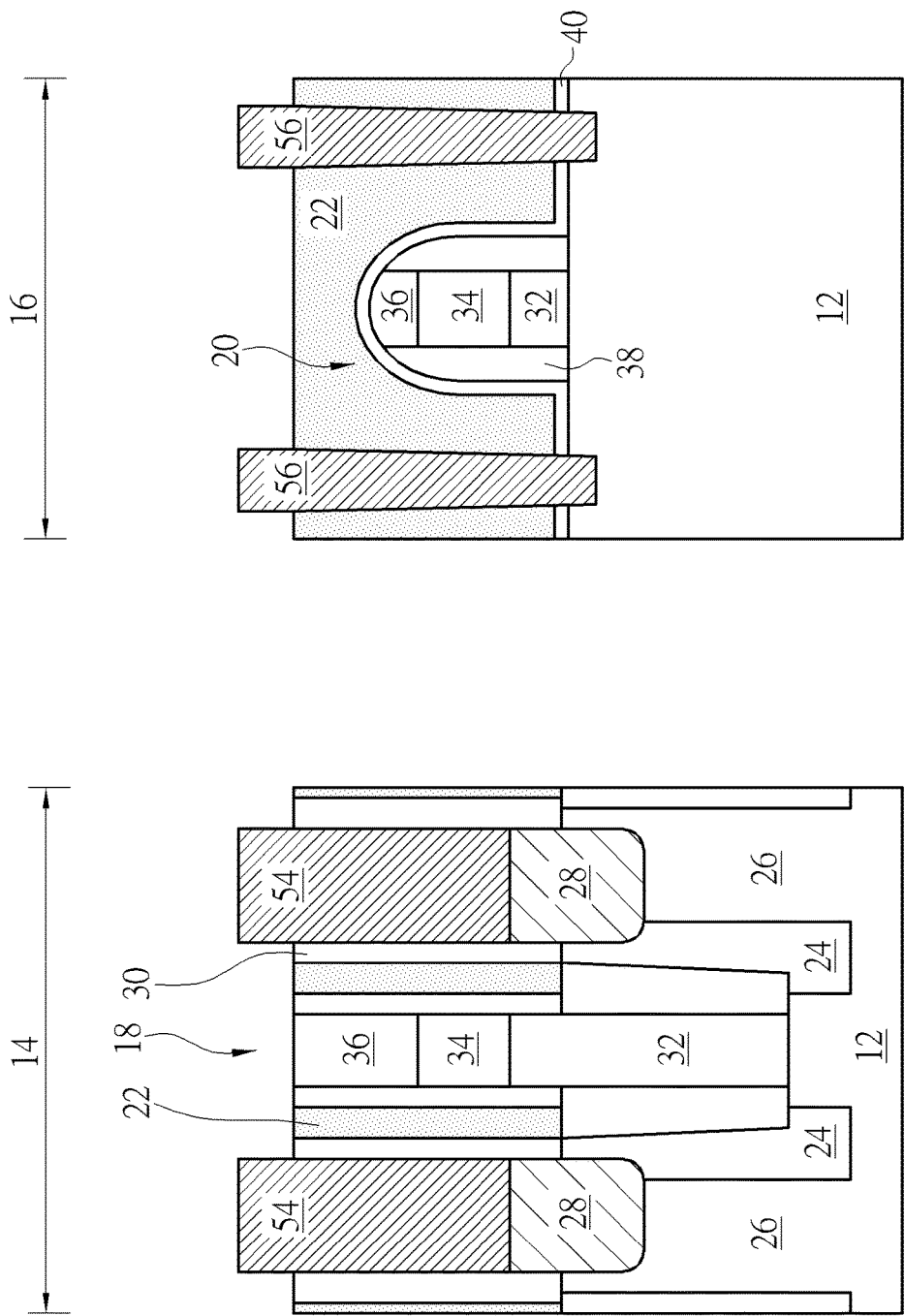
FIG. 7 illustrates cross-section views of FIG. 5 along the sectional lines CC' and DD'.

Next, referring to FIGS. 5-7, in which FIG. 5 illustrates a top view of the process conducted after FIG. 4, the left portion of FIG. 6 illustrates a cross-section of FIG. 5 along the sectional line PP', the right portion of FIG. 6 illustrates a cross-section of FIG. 5 along the sectional line QQ', the left portion of FIG. 7 illustrates a cross-section of FIG. 5 along the sectional line CC', and the right portion of FIG. 7 illustrates a cross-section of FIG. 5 along the sectional line DD'. As shown in FIGS. 5-7, an etching process is conducted by using the patterned resist 52 as mask to remove part of the SHB 50, part of the ODL 48, and part of the conductive layer 46 to form storage contacts 54 adjacent to two sides of the bit line structure 18 and contact plugs 56 adjacent to two sides of the gate structure 20. The remaining patterned resist 52, SHB 50, and ODL 48 are removed thereafter.

It should be noted that the bit line structures 18 are disposed on the cell region 14 extending a long a first direction such as X-direction and the aforementioned first photo-etching process was also conducted along the same first direction to remove part of the conductive layer 46 on the cell region 14 to form storage contacts 54 between the bit line structures 18. In other words, the direction of the first photo-etching process is preferably parallel to the extending direction of the bit line structures 18.

Figure 8:
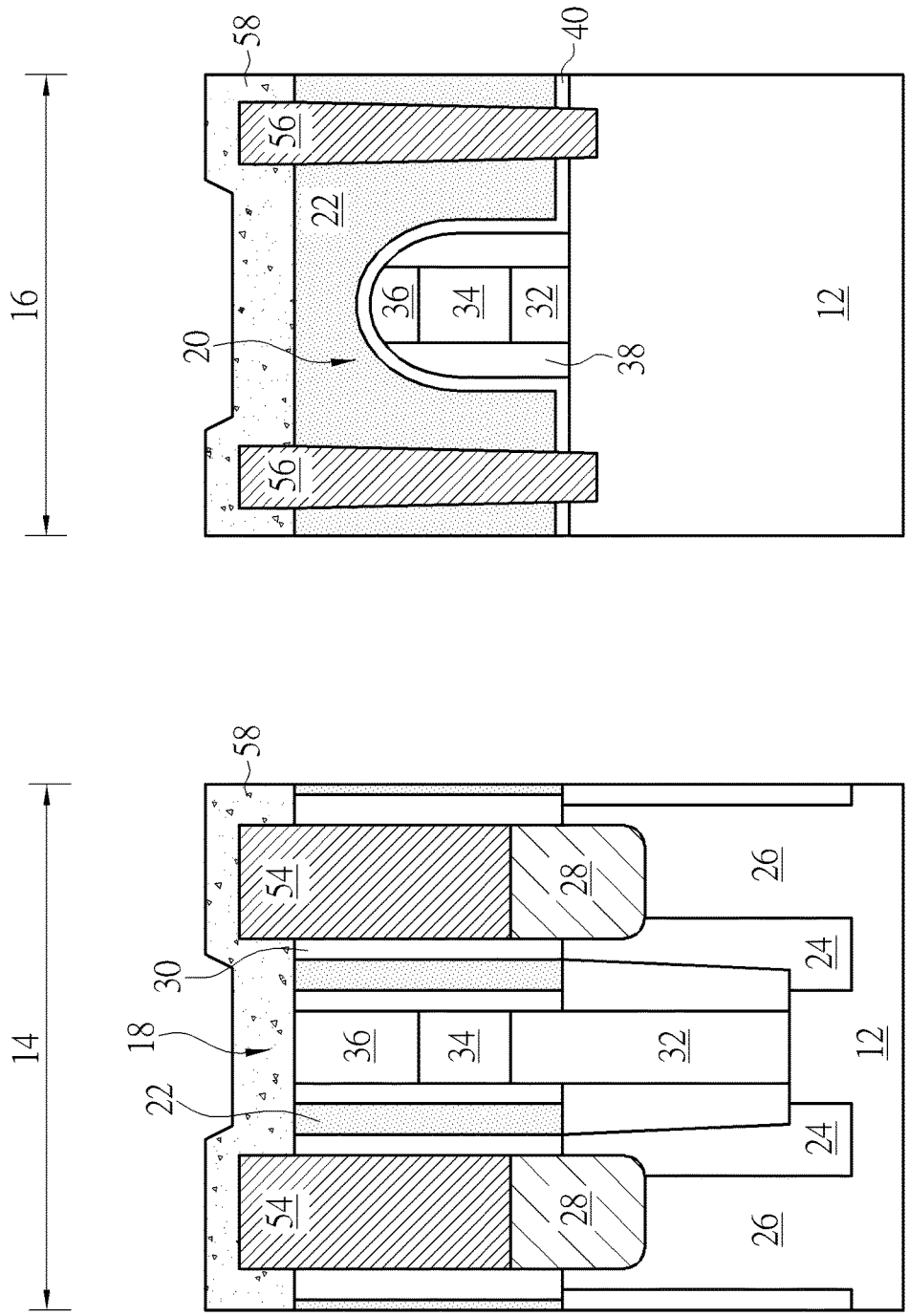
FIG. 8 illustrates cross-sectional views of the process conducted after FIG. 7.

Next, as shown in FIG. 8, a first cap layer 58 is formed on the cell region 14 and peripheral region 16 to cover the bit line structures 18 and the gate structure 20. In this embodiment, the first cap layer 58 is preferably made of silicon nitride, but could also be made of other dielectric material including but not limited to for example SiON or SiCN.

Figure 9:
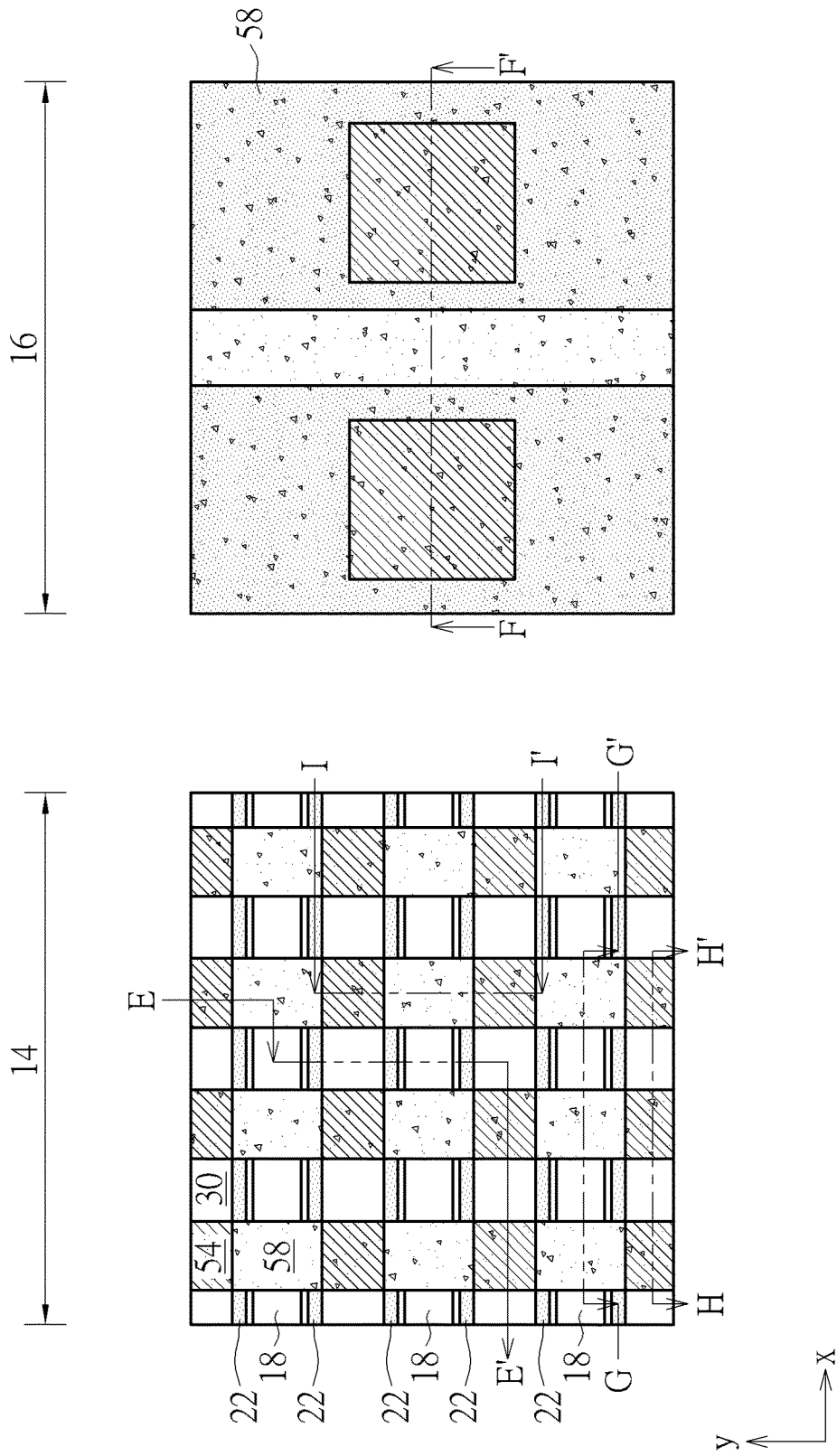
FIG. 9 illustrates top views of the process conducted after FIG. 8.
Figure 10:
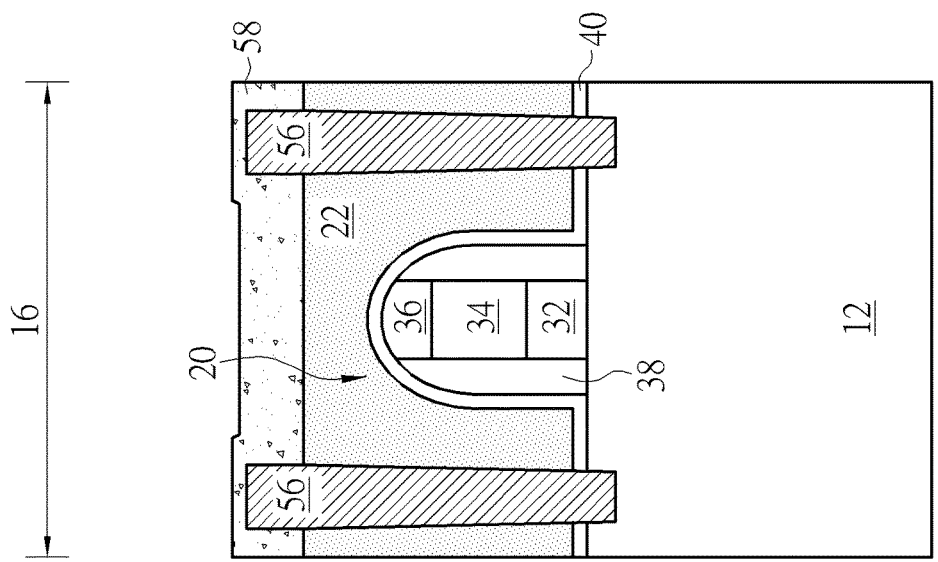
FIG. 10 illustrates cross-section views of FIG. 9 along the sectional lines EE' and FF'.
Figure 10:
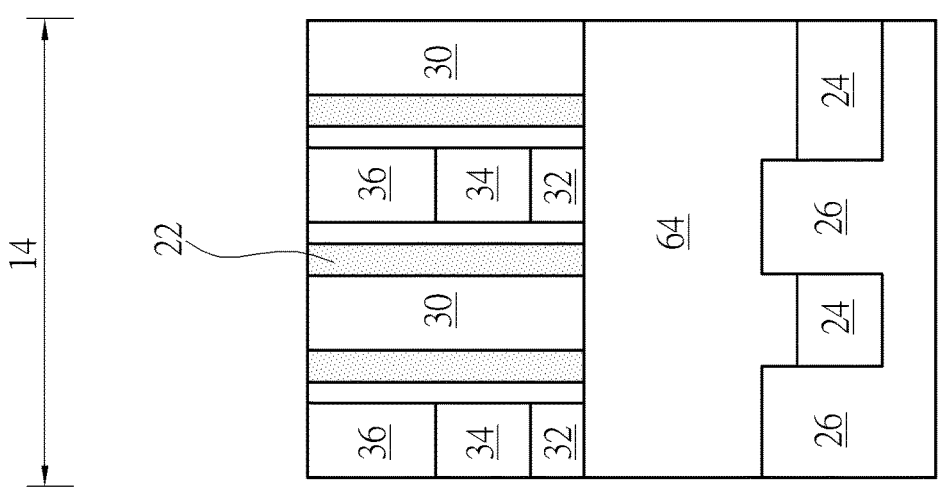
Figure 11:
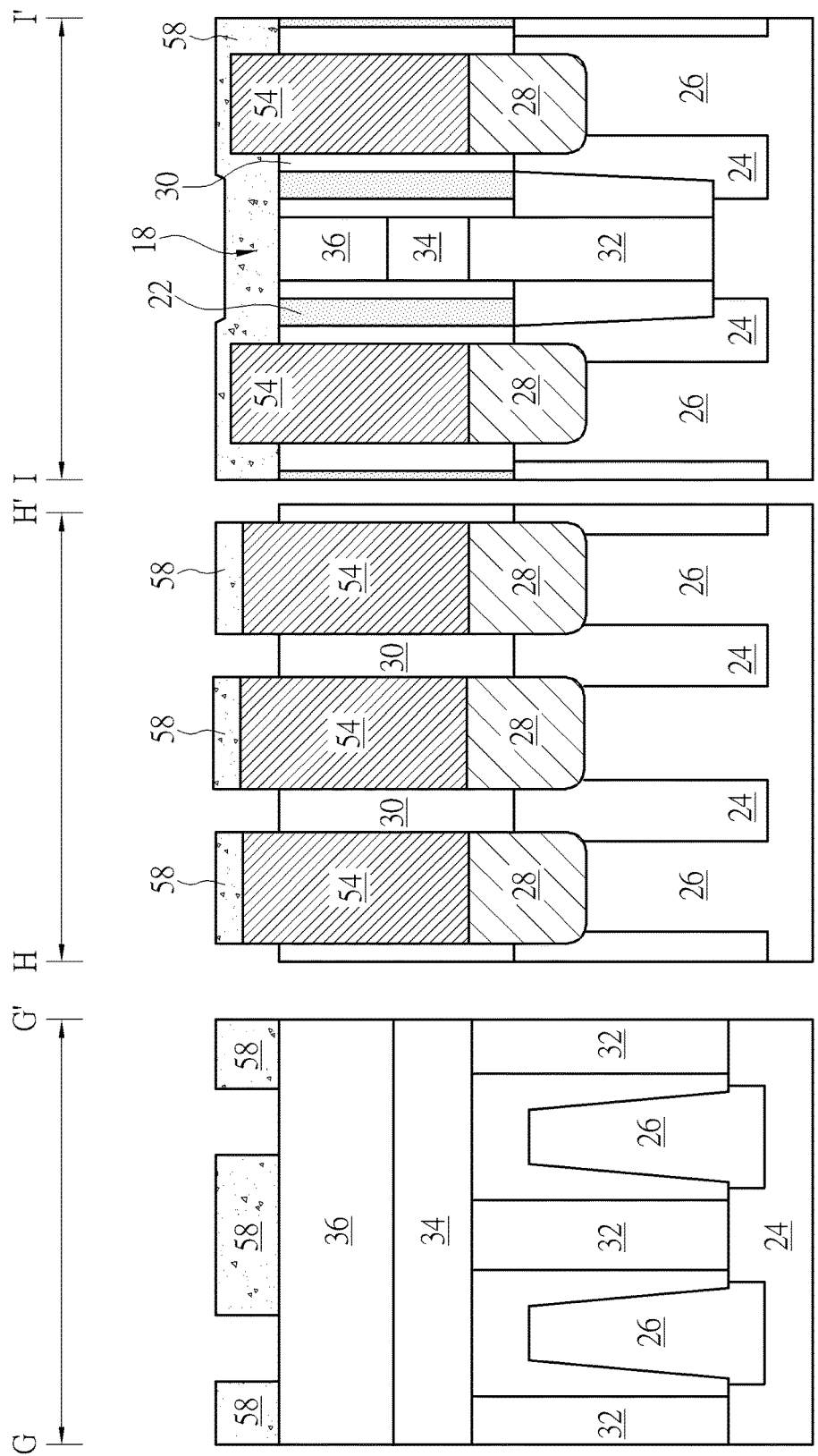
FIG. 11 illustrates cross-section views of FIG. 9 along the sectional lines GG', HH' and II'.

Next, referring to FIGS. 9-11, in which FIG. 9 illustrates a top view of the process conducted after FIG. 8, the left portion of FIG. 10 illustrates a cross-section of FIG. 9 along the sectional line EE', the right portion of FIG. 10 illustrates a cross-section of FIG. 9 along the sectional line FF', the left portion of FIG. 11 illustrates a cross-section of FIG. 9 along the sectional line GG', the middle portion of FIG. 11 illustrates a cross-section of FIG. 9 along the sectional line HH', and the right portion of FIG. 11 illustrates a cross-section of FIG. 9 along the sectional line II'. As shown in FIGS. 9-11, a section photo-etching process is conducted to remove part of the first cap layer 58 and part of the storage contacts 54 on the cell region 14. In this embodiment, the second photo-etching process could be accomplished by the same manner as the aforementioned first photo-etching process including sequentially forming a ODL, a SHB, and a patterned resist on the first cap layer 58 on cell region 14 and peripheral region 16.

Next, an etching process is conducted by using the patterned resist as mask to remove part of the SHB, part of the ODL, part of the first cap layer 58, and part of the storage contacts 54, and the remaining patterned resist, SHB, and ODL are removed thereafter.

It should be noted that in contrast to the first photo-etching process of removing part of the conductive layer 46 on cell region 14 along the first direction to form storage contacts 54, the second photo-etching process at this stage is conducted along a second direction orthogonal to the first direction, such as along Y-direction or the extending direction of the word line structures 64 to remove part of the first cap layer 58 and part of the storage contacts 54 on the cell region 14.

Specifically, such as shown on the left portion of FIG. 9, the second photo-etching process preferably removes part of the first cap layer 58 and part of the storage contacts 54 on the cell region 14 along the Y-direction so that the first cap layer 58 which was covering the entire cell region 14 now becomes rectangular stripes extending along the Y-direction to intersect or cross with the bit line structures 18. The storage contacts 54 that were rectangular stripes extending along the X-direction now become square-shaped and first cap layer 58 is still disposed on top of each of the storage contacts 54.

Figure 12:
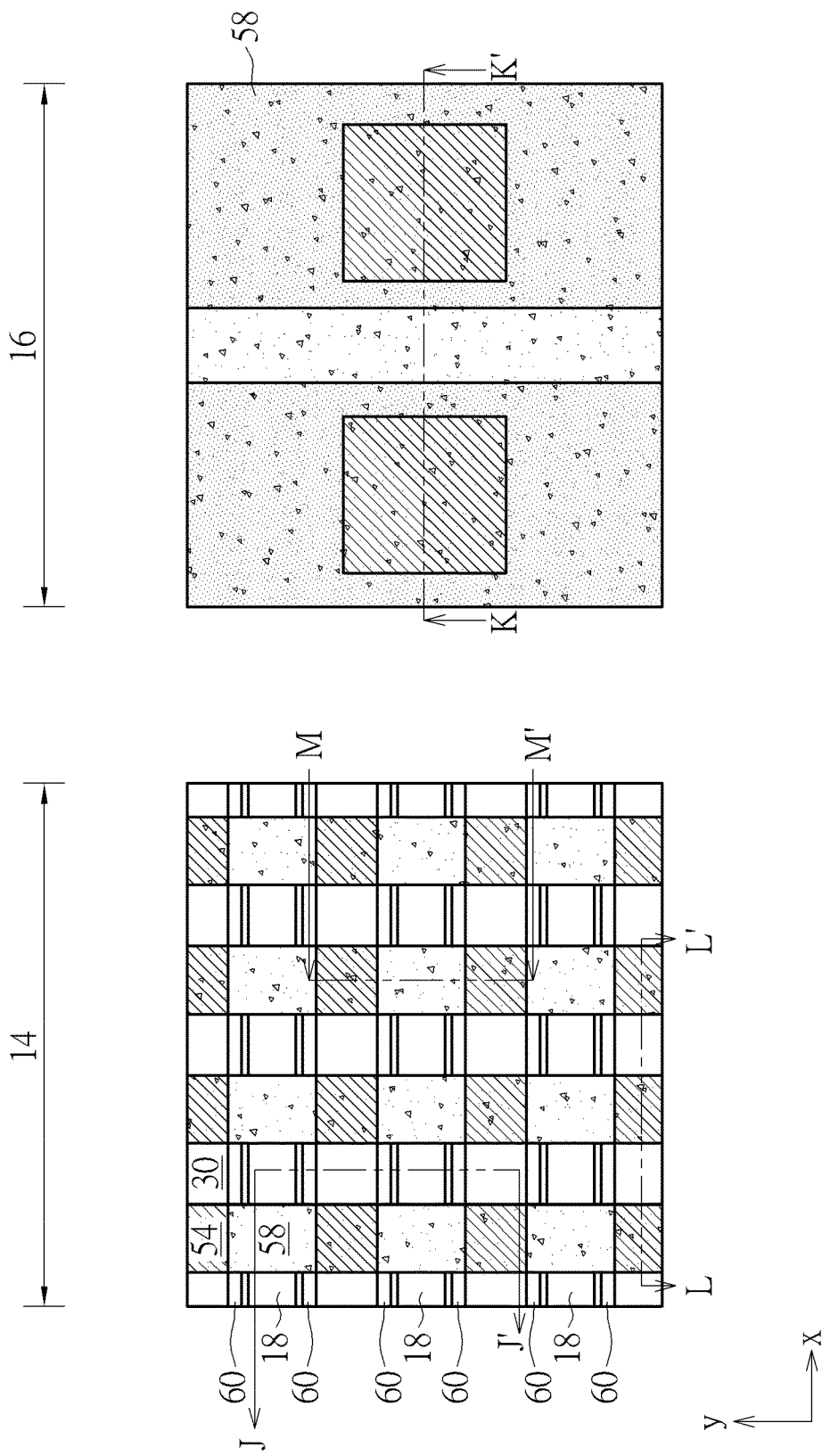
FIG. 12 illustrates top views of the process conducted after FIG. 9.
Figure 13:
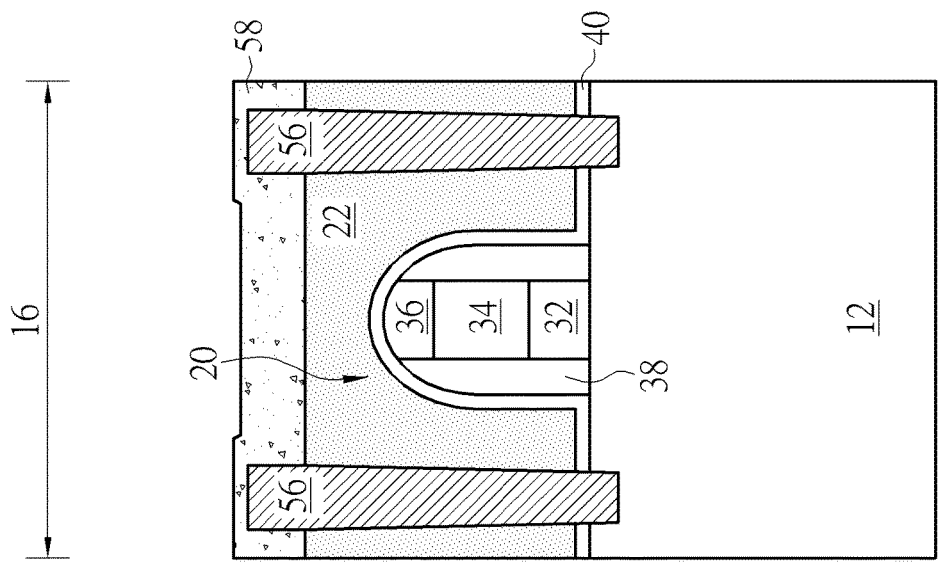
FIG. 13 illustrates cross-section views of FIG. 12 along the sectional lines JJ' and KK'.
Figure 13:
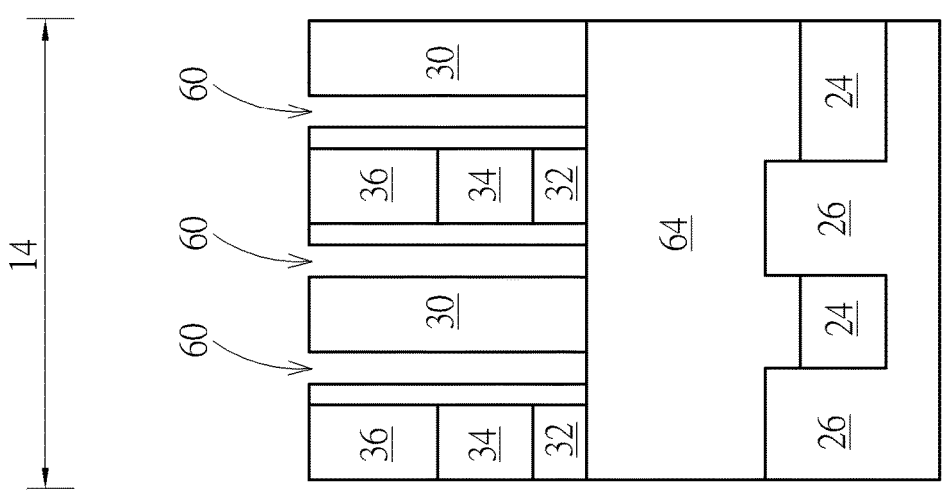
Figure 14:
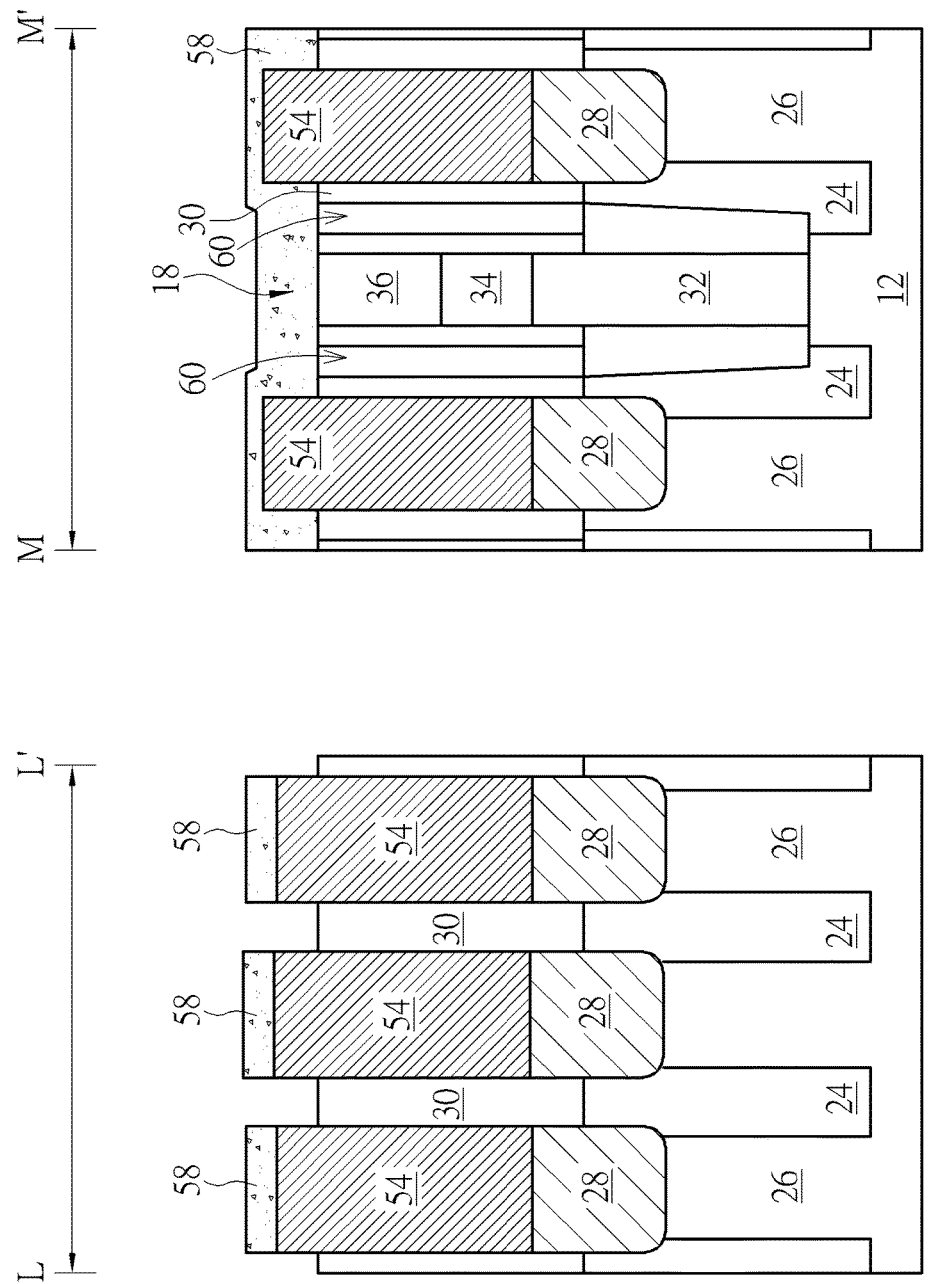
FIG. 14 illustrates cross-section views of FIG. 12 along the sectional lines LL' and MM'.

Referring to FIGS. 12-14, in which FIG. 12 illustrates a top view of the process conducted after FIG. 9, the left portion of FIG. 13 illustrates a cross-section of FIG. 12 along the sectional line JJ', the right portion of FIG. 13 illustrates a cross-section of FIG. 12 along the sectional line KK', the left portion of FIG. 14 illustrates a cross-section of FIG. 12 along the sectional line LL', and the right portion of FIG. 14 illustrates a cross-section of FIG. 12 along the sectional line MM'. As shown in FIGS. 12-14, an etching process is then conducted by using the first cap layer on peripheral region 16 as mask to remove the ILD layer 22 adjacent to two sides of the bit line structures 18 on cell region 14 for forming air gaps 60.

It should be noted that a wet etching process is preferably conducted at this stage to remove part of the ILD layer 22 not covered by the first cap layer 58 on the cell region 14, in which the etchant of the wet etching process first removes the ILD layer 22 not covered by the first cap layer 58 and the removes the adjacent ILD layer 22 that was already covered by the first cap layer 58, as shown by the cross-section view extending along the sectional line MM' in FIG. 12. In other words, air gaps 60 are formed adjacent to two sides of the bit line structures 18 extending along the X-direction, in which part of the air gap 60 is not covered by the first cap layer 58 while part of the air gap 60 is covered by the first cap layer 58.

Figure 15:
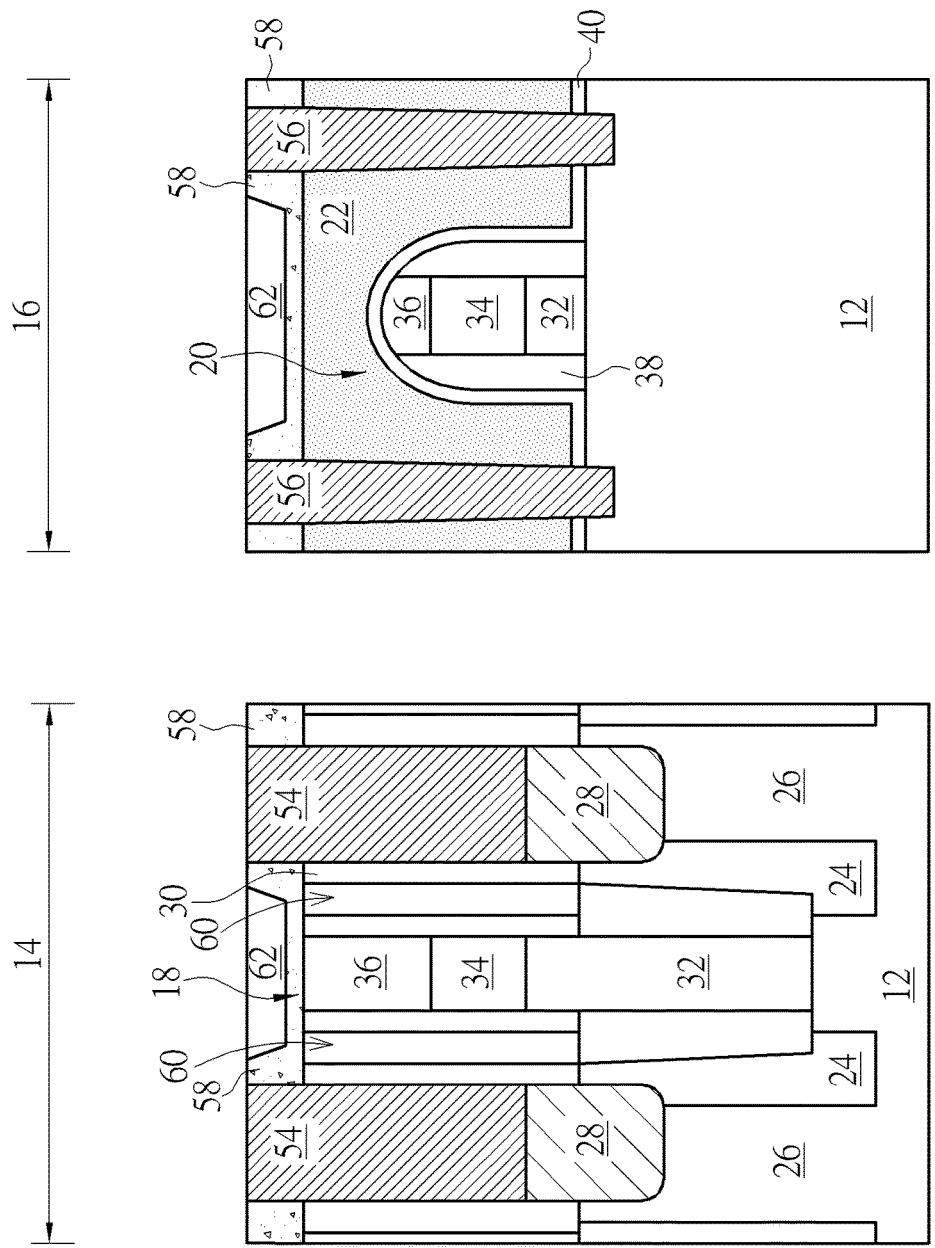
FIG. 15 illustrates a structural view of a semiconductor device according to an embodiment of the present invention.

Referring to FIG. 15, the left portion of FIG. 15 illustrates a cross-section of the process conducted after FIG. 14 along the sectional line MM' and the right portion of FIG. 15 illustrates a cross-section of the process conducted after FIG. 13 along the sectional line KK'. As shown in FIG. 15, a second cap layer 62 is then formed on the first cap layer 58 on the cell region 14 and peripheral region 16, and a planarizing process such as chemical mechanical polishing (CMP) process is conducted to remove part of the second cap layer 62 and part of the first cap layer 58 and even part of the storage contacts 54 and part of the contact plugs 56 so that the top surfaces of the first cap layer 58 and second cap layer 62 are even with the top surfaces of the storage contacts 54 and contact plugs 56. Next, a storage capacitor could be formed on the cell region 14 to connect to the storage contacts 54. This completes the fabrication of a DRAM device according to an embodiment of the present invention.

Referring again to FIG. 15, FIG. 15 illustrates a structural view of a semiconductor device according to an embodiment of the present invention. As shown in FIG. 15, the semiconductor device includes a bit line structure 18 disposed on the cell region, air gaps 60 and storage contacts 54 disposed adjacent to two sides of the bit line structure 18, a gate structure 20 disposed on the peripheral region 16, an ILD 22 disposed on the gate structure 20 on the peripheral region 16, contact plugs 56 disposed adjacent to two sides of the gate structure 20 within the ILD layer 22, a first cap layer 58 disposed on the bit line structure 18 and air gaps 60 on the cell region 14 and gate structure 20 on the peripheral region 16, and a second cap layer 62 disposed on the first cap layer 58.

Viewing from a more detailed perspective, the first cap layer 58 disposed between the storage contacts 54 on the cell region 14 is U-shaped, and the top surface of the storage contacts 54 is even with the top surfaces of the first cap layer 58 and second cap layer 62. Preferably, the first cap layer 58 and the second cap layer 62 are made of different material, in which the first cap layer 58 includes silicon nitride while the second cap layer 62 includes SiCN, but not limited thereto. The storage contacts 54 and contact plugs 56 could be made of same material such as tungsten, but not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a cell region and a peripheral region;
   forming a bit line structure on the cell region and a gate structure on the peripheral region;
   forming an interlayer dielectric (ILD) layer around the bit line structure and the gate structure;
   forming a conductive layer on the cell region and the peripheral region;
   performing a first photo-etching process to remove part of the conductive layer for forming storage contacts adjacent two sides of the bit line structure and contact plugs adjacent to two sides of the gate structure;
   forming a first cap layer on the cell region and the peripheral region to cover the bit line structure and the gate structure; and
   performing a second photo-etching process to remove part of the first cap layer on the cell region.

2. The method of claim 1, wherein the bit line structure is disposed along a first direction on the cell region.

3. The method of claim 2, further comprising performing the first photo-etching process to remove part of the conductive layer along the first direction for forming the storage contacts.

4. The method of claim 1, further comprising performing the second photo-etching process to remove part of the first cap layer along a second direction.

5. The method of claim 4, wherein the second direction is orthogonal to the first direction.

6. The method of claim 1, further comprising removing part of the ILD layer adjacent to two sides of the bit line structure for forming air gaps after performing the second photo-etching process.

7. The method of claim 6, wherein the first cap layer is on the bit line structure and the air gaps.

8. The method of claim 7, wherein the first cap layer is U-shaped.

9. The method of claim 1, further comprising forming a second cap layer on the cell region and the peripheral region.

10. The method of claim 9, wherein the second cap layer and the first cap layer comprise a dielectric material.

11. The method of claim 9, wherein the first cap layer and the second cap layer comprise different material.

12. The method of claim 9, wherein the second cap layer comprises silicon carbon nitride (SiCN).

13. The method of claim 1, wherein the first cap layer comprises silicon nitride.

14. The method of claim 1, wherein the ILD layer comprises silicon oxide.

15. The method of claim 1, wherein the storage contacts comprise tungsten.

16. A method for fabricating semiconductor device, comprising:
    providing a substrate having a cell region and a peripheral region;
    forming a bit line structure on the cell region;
    forming air gaps adjacent to two sides of the bit line structure;
    forming a first cap layer on the bit line structure and the air gaps, wherein the first cap layer is U-shaped; and
    forming a second cap layer on the first cap layer, wherein the second cap layer and the first cap layer comprise a dielectric material.

17. The method of claim 16, further comprising forming storage contacts adjacent to two sides of the bit line structure.

18. The method of claim 17, wherein a top surface of the storage contacts is even with the top surfaces of the first cap layer and the second cap layer.

19. The method of claim 16, wherein the first cap layer and the second cap layer comprise different material.

20. The method of claim 16, further comprising:
    forming a gate structure on the peripheral region;
    forming an interlayer dielectric (ILD) layer on the gate structure; and
    forming contact plugs adjacent to two sides of the gate structure and within the ILD layer.

* * * * *